(12) United States Patent
Kuwahara

(10) Patent No.: US 10,585,362 B2
(45) Date of Patent: Mar. 10, 2020

(54) SUBSTRATE PROCESSING APPARATUS, ALIGNMENT DEVICE, SUBSTRATE PROCESSING METHOD AND ALIGNMENT METHOD

(71) Applicant: SCREEN HOLDINGS CO., LTD., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/041,139

(22) Filed: Jul. 20, 2018

(65) Prior Publication Data

US 2019/0049865 A1   Feb. 14, 2019

(30) Foreign Application Priority Data

Aug. 8, 2017   (JP) .................................. 2017-153099

(51) Int. Cl.
| | | |
|---|---|---|
| *G03B 27/54* | (2006.01) | |
| *G03F 9/00* | (2006.01) | |
| *G03F 7/20* | (2006.01) | |
| *H01L 21/68* | (2006.01) | |
| *H01L 21/687* | (2006.01) | |

(52) U.S. Cl.
CPC ........ *G03F 9/7042* (2013.01); *G03F 7/70141* (2013.01); *H01L 21/681* (2013.01); *H01L 21/68707* (2013.01)

(58) Field of Classification Search
CPC . G03F 9/7042; G03F 7/70141; H01L 21/681; H01L 21/68707
See application file for complete search history.

(56) References Cited

U.S. PATENT DOCUMENTS

| | | | |
|---|---|---|---|
| RE38,113 E * | 5/2003 | Nishi | G03F 7/70358 355/53 |
| 2003/0198376 A1 | 10/2003 | Sadighi et al. | 382/153 |
| 2003/0202092 A1 | 10/2003 | Sadighi et al. | 348/87 |
| 2004/0031779 A1 | 2/2004 | Cahill et al. | 219/121.83 |
| 2007/0112465 A1 | 5/2007 | Sadighi et al. | 700/254 |
| 2010/0109202 A1 | 5/2010 | Choi et al. | 246/409 |
| 2016/0358829 A1 | 12/2016 | Hayashi et al. | 438/16 |

FOREIGN PATENT DOCUMENTS

| | | |
|---|---|---|
| JP | 2006-522476 A | 9/2006 |
| KR | 10-2016-0142 | 12/2016 |

OTHER PUBLICATIONS

Decision to Grant a Patent dated Aug. 27, 2019 for Taiwanese Patent Application No. 107124622.

* cited by examiner

*Primary Examiner* — Peter B Kim
(74) *Attorney, Agent, or Firm* — Ostrolenk Faber LLP

(57) ABSTRACT

In a substrate processing apparatus, an optical sensor is provided at a hand that transports a substrate to a processing unit, and an optical fiber is provided at a fixed member that has a certain positional relationship with a spin chuck in the processing unit. When the hand has a predetermined positional relationship with the spin chuck in the processing unit, the light emitted from a first light emitter of the optical sensor is received by a second light receiver of the optical fiber and guided to a second light emitter of the optical fiber, and the light emitted from the second light emitter is received by a first light receiver. A light receiving signal corresponding to an amount of light received by the first light receiver is output from the optical sensor.

20 Claims, 7 Drawing Sheets

SUBSTRATE PROCESSING APPARATUS, ALIGNMENT DEVICE, SUBSTRATE PROCESSING METHOD AND ALIGNMENT METHOD

BACKGROUND OF THE INVENTION

Field of the Invention

The present invention relates to a substrate processing apparatus that performs processing on a substrate, an alignment device that aligns a movable member with respect to a fixed member, a substrate processing method and an alignment method.

Description of Related Art

Substrate processing apparatuses have been used to subject various types of substrates such as semiconductor substrates, substrates for liquid crystal displays, substrates for plasma displays, substrates for optical discs, substrates for magnetic discs, substrates for magneto-optical discs, substrates for photomasks and other substrates to various types of processing.

In such a substrate processing apparatus, processing is generally consecutively performed on one substrate in a plurality of processing units. Therefore, a substrate transport device that transports the substrate among the plurality of processing units is provided in the substrate processing apparatus. Teaching of the substrate transport device is performed in advance in order for the substrate to be accurately carried into and carried out from a predetermined processing unit.

JP 2006-522476 A describes a processing system including a plurality of processing chambers and a vision system for calibrating a position of an end effector (a substrate holder) of a robot (substrate transport device). In the vision system, a camera assembly including a camera, a power source, a transmitter and an arrangement plate is transported by the end effector (substrate holder) of the robot. The position of the end effector of the robot is calibrated based on an image acquired by the camera of the camera assembly.

BRIEF SUMMARY OF THE INVENTION

The above-mentioned camera assembly is fabricated to be light and compact such that the end effector is not deformed with the camera assembly held by the end effector. Therefore, the camera assembly is costly.

An object of the present invention is to provide a substrate processing apparatus and an alignment device that can align a movable member with respect to a fixed member with a simple configuration and at low cost, and a substrate processing method and an alignment method with which the movable member can be aligned with respect to the fixed member with the simple configuration and at low cost.

(1) A substrate processing apparatus according to one aspect of the present invention that performs processing on a substrate includes a fixed portion, a movable portion that is movable relative to the fixed portion, an optical sensor that is provided at one of the fixed portion and the movable portion and has a first light emitter and a first light receiver, and a light guide member that is provided at another one of the fixed portion and the movable portion and has a second light receiver corresponding to the first light emitter and a second light emitter corresponding to the first light receiver, wherein the first light emitter, the first light receiver, the second light emitter and the second light receiver are arranged such that light emitted from the first light emitter is received by the second light receiver when the movable portion has a predetermined positional relationship with the fixed portion, and are arranged such that light emitted from the second light emitter is received by the first light receiver when the movable portion has the predetermined positional relationship with the fixed portion.

In the substrate processing apparatus, when the movable portion has the predetermined positional relationship with the fixed portion, the light emitted from the first light emitter is received by the second light receiver and guided to the second light emitter by the light guide member, and the light emitted from the second light emitter is received by the first light receiver. Therefore, whether the movable portion has the predetermined positional relationship with the fixed portion can be determined based on an output signal of the optical sensor.

In this case, because the optical sensor is electrically independent from the light guide member, the wiring between the fixed portion and the movable portion is unnecessary. Therefore, the configuration for detecting the position of the movable portion with respect to the fixed portion is not complicated. Further, the position of the movable portion with respect to the fixed portion can be detected at low cost.

As a result, the movable member can be aligned with respect to the fixed member with a simple configuration and at low cost.

(2) The substrate processing apparatus may further include a substrate supporter that supports the substrate, wherein the fixed portion may include a fixed member that has a certain (predetermined) positional relationship with the substrate supporter, and the movable portion may include a transport holder that holds and transports the substrate to the substrate supporter.

With such a configuration, when the substrate is transported to the substrate supporter by the transport holder, the transport holder can be aligned with respect to the fixed member with a simple configuration and at low cost. In this case, because the fixed member has the certain positional relationship with the substrate supporter, the transport holder can be aligned with respect to the substrate supporter with a simple configuration and at low cost.

(3) The substrate processing apparatus may further include a processing unit that performs processing on the substrate, wherein the substrate supporter may include a rotation holder that holds and rotates the substrate in the processing unit, and the fixed member may have a certain (predetermined) positional relationship with the rotation holder.

In this case, the transport holder can be aligned with respect to the rotation holder in the processing unit with a simple configuration and at low cost.

(4) The substrate processing apparatus may include a plurality of substrate supporters that support the substrate, wherein the fixed portion may include a plurality of fixed members having certain (predetermined) positional relationships with the plurality of substrate supporters, the movable portion may include a transport holder that holds and transports the substrate to the plurality of substrate supporters, the optical sensor may be provided at the transport holder, and the light guide member may be provided at each of the plurality of fixed members.

In this case, the light guide member is less costly than the optical sensor. In the above-mentioned configuration, because the optical sensor is provided at the transport holder, and the light guide member is provided at each of the plurality of fixed members, even when the number of fixed members is large, an increase of the cost is suppressed.

(5) The substrate processing apparatus may further include a rotation holder that holds and rotates the substrate, wherein the fixed portion may include a fixed member that has a certain (predetermined) positional relationship with the rotation holder, and the movable portion may include a processing member that performs predetermined processing on the substrate held by the rotation holder.

With such a configuration, when processing is performed by the processing member on the substrate held by the rotation holder, the processing member can be aligned with respect to the fixed member with a simple configuration and at low cost. In this case, because the fixed member has the certain positional relationship with the rotation holder, the processing member can be aligned with respect to the rotation holder with a simple configuration and at low cost.

(6) The processing member may be a fluid nozzle that supplies fluid to the substrate held by the rotation holder.

With such a configuration, when the fluid is supplied by the fluid nozzle to the substrate held by the rotation holder, the fluid nozzle can be aligned with respect to the fixed member with a simple configuration and at low cost. In this case, because the fixed member has the certain positional relationship with the rotation holder, the fluid nozzle can be aligned with respect to the rotation holder with a simple configuration and at low cost.

(7) The substrate processing apparatus may further include a determiner that determines whether the movable portion has the predetermined positional relationship with the fixed portion based on an output signal of the optical sensor.

In this case, the movable member can be aligned with respect to the fixed member based on a result of determination of the determiner.

(8) The substrate processing apparatus may further include a driver that moves the movable portion relative to the fixed portion, an alignment controller that controls the driver during an alignment operation such that the movable portion is moved within a predetermined region including the fixed portion, an acquirer that acquires a position of the movable portion as current position information during the alignment operation, a generator that generates a position of the movable portion when the movable portion has the predetermined positional relationship with the fixed portion as target position information during the alignment operation based on the current position information acquired by the acquirer and a result of determination of the determiner, and a movement controller that controls the driver during a substrate processing operation such that the movable portion is moved based on the target position information generated by the generator.

In this case, the target position information is generated by the alignment operation, and the movement of the movable portion with respect to the fixed portion is controlled based on the target position information during the substrate processing operation. Thus, in the substrate processing operation, the movable portion can be easily aligned with respect to the fixed portion.

(9) The substrate processing apparatus may be settable in a substrate processing mode or a teaching mode, and the alignment operation may be performed during the teaching mode, and the substrate processing operation may be performed during the substrate processing mode.

In this case, teaching of the movable member with respect to the fixed member can be carried out with a simple configuration and at low cost.

(10) An alignment device according to another aspect of the present invention includes a fixed portion, a movable portion that is movable relative to the fixed portion, an optical sensor that is provided at one of the fixed portion and the movable portion and has a first light emitter and a first light receiver, a light guide member that is provided at another one of the fixed portion and the movable portion, and has a second light receiver corresponding to the first light emitter and a second light emitter corresponding to the first light receiver, and a determiner that determines whether the movable portion has a predetermined positional relationship with the fixed portion based on an output signal of the optical sensor, wherein the first light emitter, the first light receiver, the second light emitter and the second light receiver are arranged such that light emitted from the first light emitter is received by the second light receiver when the movable portion has the predetermined positional relationship with the fixed portion, and are arranged such that light emitted from the second light emitter is received by the first light receiver when the movable portion has the predetermined positional relationship with the fixed portion.

In the alignment device, when the movable portion has the predetermined positional relationship with the fixed portion, the light emitted from the first light emitter is received by the second light receiver and guided to the second light emitter by the light guide member, and the light emitted from the second light emitter is received by the first light receiver. Further, whether the movable portion has the predetermined positional relationship with the fixed portion is determined based on the output signal of the optical sensor.

In this case, because the optical sensor is electrically independent from the light guide member, the wiring between the fixed portion and the movable portion is unnecessary. Therefore, the configuration for detecting the position of the movable portion with respect to the fixed portion is not complicated. Further, the position of the movable portion with respect to the fixed portion can be detected at low cost.

As a result, the movable member can be aligned with respect to the fixed member with a simple configuration and at low cost.

(11) A substrate processing method according to yet another aspect of the present invention for performing processing on a substrate with use of a substrate processing apparatus includes arranging a first light emitter, a first light receiver, a second light emitter and a second light receiver such that light emitted from the first light emitter is received by the second light receiver when a movable portion provided with a light guide member having the second light receiver and the second light emitter has a predetermined positional relationship with a fixed portion provided with an optical sensor having the first light emitter and the first light receiver, and arranging the first light emitter, the first light receiver, the second light emitter and the second light receiver such that light emitted from the second light emitter is received by the first light receiver when the movable portion provided with the light guide member having the second light receiver and the second light emitter has the predetermined positional relationship with the fixed portion provided with the optical sensor having the first light emitter and the first light receiver, and moving the movable member relative to the fixed portion.

In this alignment method, because the optical sensor is electrically independent from the light guide member, the wiring between the fixed portion and the movable portion is unnecessary. Therefore, the configuration for detecting the position of the movable portion with respect to the fixed portion is not complicated. Further, the position of the movable portion with respect to the fixed portion can be detected at low cost.

As a result, the movable member can be aligned with respect to the fixed member with a simple configuration and at low cost.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus, an alignment device, a substrate processing method and an alignment method according to embodiments of the present invention will be described below with reference to the drawings. In the following description, a substrate refers to a semiconductor substrate, a substrate for an FPD (a Flat Panel Display) such as a liquid crystal display device or an organic EL (Electroluminescence) display device, a substrate for an optical disc, a substrate for a magnetic disc, a substrate for a magneto-optical disc, a substrate for a photomask, a substrate for a solar cell or the like.

[1] Basic Configuration of Substrate Processing Apparatus

The substrate processing apparatus according to the present embodiment includes a processing unit that performs processing on a substrate and a substrate transport device that transports the substrate. The processing unit includes a substrate supporter that supports the substrate, and a substrate transport device that holds and transports the substrate to the substrate supporter of the processing unit.

In the present embodiment, the substrate supporter is a spin chuck that supports a back surface (lower surface) of the substrate by suction, a spin chuck that holds an outer peripheral end of the substrate W, a plurality of support pins that respectively support a plurality of portions of the back surface of the substrate W or a plate on which the substrate W is placed, for example.

Figure 1:
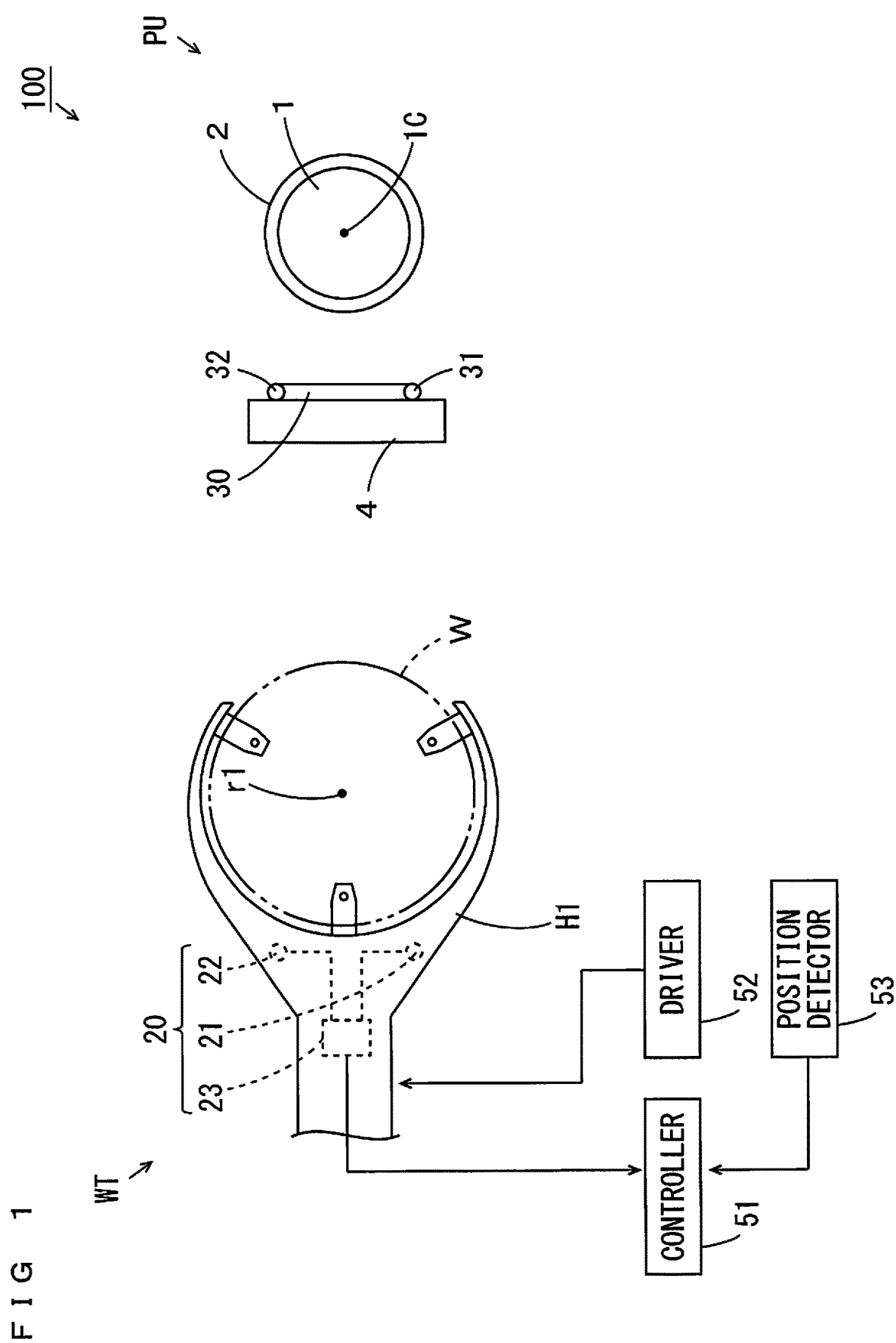
FIG. 1 is a diagram showing part of a configuration of a substrate processing apparatus according to one embodiment of the present invention.

FIG. 1 is a diagram showing part of the configuration of the substrate processing apparatus according to one embodiment of the present invention. In FIG. 1, the configuration of the substrate transport device WT and part of the configuration of the processing unit PU are shown as part of the configuration of the substrate processing apparatus 100 according to the present embodiment.

As shown in FIG. 1, the substrate transport device WT includes a hand H1 for holding the substrate W, an optical sensor 20, a controller 51, a driver 52 and a position detector 53. The driver 52 is constituted by a plurality of motors, and moves the hand H1 in an up-and-down direction (a vertical direction in the present example) and a horizontal direction and rotates the hand H1 about an axis extending in the vertical direction according to the control of the controller 51. The position detector 53 is constituted by a plurality of encoders corresponding to the plurality of motors of the driver 52, and outputs a signal indicating a current position of the hand H1 to the controller 51 based on an operation of the driver 52. Thus, the controller 51 can acquire the position of the hand H1 in the substrate processing apparatus 100 as current position information.

The optical sensor 20 is a photoelectric sensor, for example, and includes a first light emitter 21, a first light receiver 22 and a sensor main body 23. The first light emitter 21 and the sensor main body 23 are connected to each other by an optical fiber (fibers), and the first light receiver 22 and the sensor main body 23 are connected to each other by optical fibers. The first light emitter 21 and the first light receiver 22 are attached to a lower surface of the hand H1. The sensor main body 23 includes a light source, a light receiving element and a control circuit. The light source is an LED (a light-emitting diode), for example, and supplies light to the first light emitter 21. A laser diode or another light emitting element may be used as the light source. The light receiving element generates a light receiving signal corresponding to an amount of light received by the first light receiver 22. The control circuit controls the light source and outputs a light receiving signal generated by the light receiving element to the controller 51.

The processing unit PU of FIG. 1 includes a spin chuck 1 that holds and rotates the substrate W. The spin chuck 1 is supported to be rotatable about a rotation axis 1C by a rotation driver 2. The processing unit PU is provided with a fixed member 4 that is fixed to have a certain positional relationship with the spin chuck 1. The fixed member 4 is provided with an optical fiber 30.

The optical fiber 30 has a second light receiver 31 and a second light emitter 32. The second light receiver 31 is constituted by one end surface (a light incidence surface), of the optical fiber 30, and the second light emitter 32 is constituted by another end surface (a light emitting surface) of the optical fiber 30.

The second light receiver 31 corresponds to the first light emitter 21 of the optical sensor 20, and the second light emitter 32 corresponds to the first light receiver 22 of the optical sensor 20. The distance between the first light emitter 21 and the first light receiver 22 is equal to the distance between the second light receiver 31 and the second light emitter 32.

In the following description, the position on the hand H1 at which the center of the substrate W held by the hand H1 is to be positioned is referred to as a reference position r1.

Figure 2A:
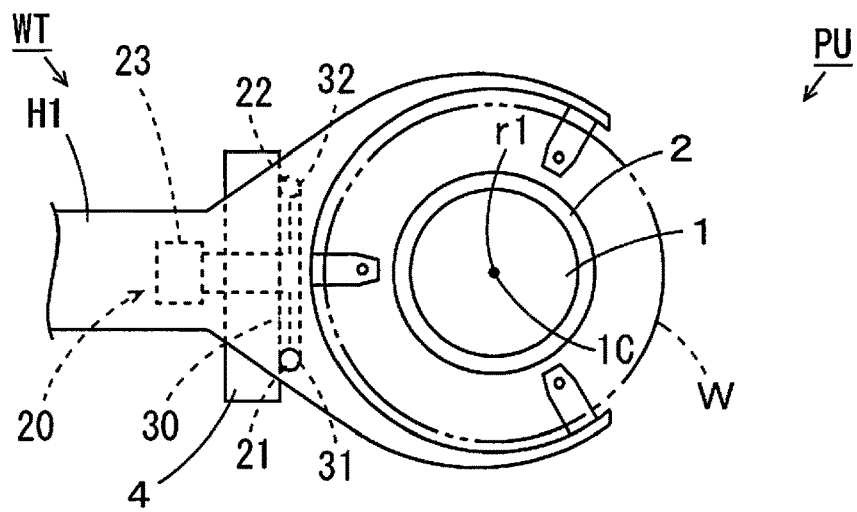
FIGS. 2A to 2C are a plan view, a side view and a front view of a hand and a processing unit of FIG. 1 when a reference position on the hand of FIG. 1 coincides with a rotation axis of a spin chuck of FIG. 1.
Figure 2B:
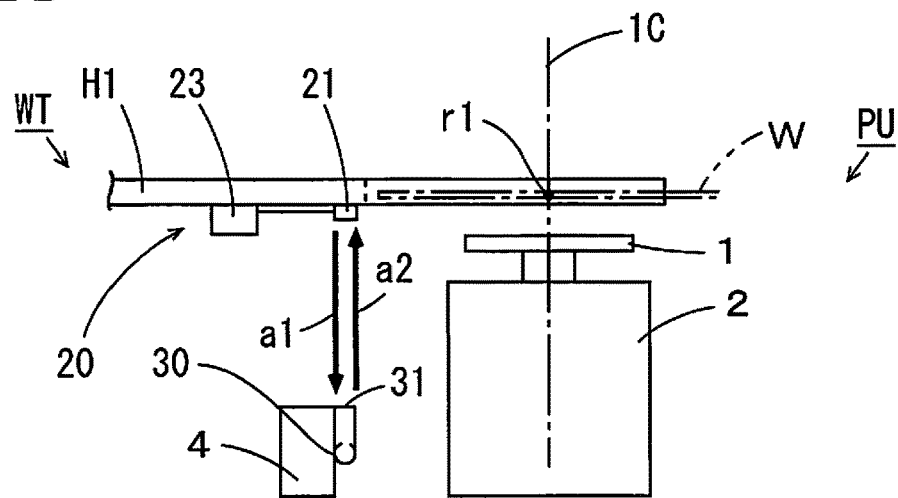
Figure 2C:
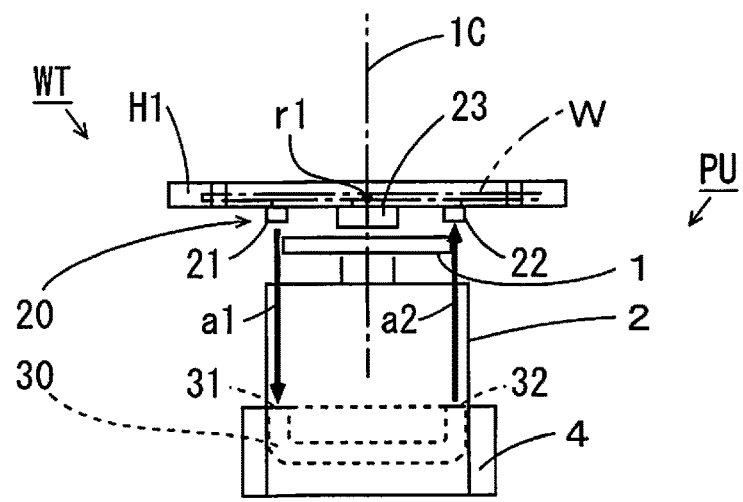

FIGS. 2A, 2B and 2C are a plan view, a side view and a front view of the hand H1 and the processing unit PU of FIG. 1 when the reference position r1 on the hand H1 of FIG. 1 coincides with the rotation axis 1C of the spin chuck 1 of FIG. 1.

As shown in FIGS. 2A to 2C, the first light emitter 21 of the optical sensor 20 and the second light receiver 31 of the optical fiber 30 are arranged to be opposite to each other in the up-and-down direction when the reference position r1 on the hand H1 coincides with the rotation axis 1C of the spin chuck 1 of FIG. 1. Further, the first light receiver 22 of the optical sensor 20 and the second light emitter 32 of the optical fiber 30 are arranged to be opposite to each other in the up-and-down direction when the reference position r1 on the hand H1 coincides with the rotation axis 1C of the spin chuck 1 of FIG. 1. That is, the first light emitter 21, the first light receiver 22, the second light receiver 31 and the second light emitter 32 are arranged such that the light emitted from the first light emitter 21 is incident on the second light receiver 31 when the reference position r1 on the hand H1 coincides with the rotation axis 1C of the spin chuck 1 of FIG. 1. Further, the first light emitter 21, the first light receiver 22, the second light receiver 31 and the second light emitter 32 are arranged such that the light emitted from the second light emitter 32 is incident on the first light receiver 22 when the reference position r1 on the hand H1 coincides with the rotation axis 1C of the spin chuck 1 of FIG. 1. In such a configuration, when light is supplied to the first light emitter 21 from a light source of the sensor main body 23, a large part of the light emitted from the first light emitter 21 is incident on the second light receiver 31 and led to the second light emitter 32 by the optical fiber 30 as indicated by thick arrows a1 in FIGS. 2B and 2C. Further, the large part of the light emitted from the second light emitter 32 is incident on the first light receiver 22 as indicated by thick arrows a2 in FIGS. 2B and 2C. Thus, the level of the light receiving signal generated by the light receiving element in the optical sensor 20 is raised.

On the other hand, when the reference position r1 on the hand H1 deviates from the rotation axis 1C of the spin chuck 1 of FIG. 1, the light emitted from the first light emitter 21 is not incident on the second light receiver 31, or part of the light emitted from the first light emitter 21 is incident on the second light receiver 31. Therefore, the light is not incident at all or a small amount of light is incident on the first light receiver 22. Therefore, the level of the light receiving signal generated by the light receiving element in the optical sensor 20 becomes 0 or substantially 0.

Thus, the hand H1 can be aligned with respect to the spin chuck 1 based on the level of the light receiving signal that is output from the optical sensor 20 such that the reference position r1 on the hand H1 coincides with the rotation axis 1C of the spin chuck 1 of FIG. 1. The hand H1 is aligned with respect to the spin chuck 1. Therefore, the substrate W held by the hand H1 can be placed on the spin chuck 1 such that the center of the substrate W coincides with the rotation axis 1C. Further, the substrate W placed on the spin chuck 1 can be received by the hand H1 such that the center of the substrate W coincides with the reference position r1 on the hand H1.

In the present embodiment, when the hand H1 is aligned with respect to the spin chuck 1, the driver 52 is controlled such that the reference position r1 on the hand H1 is moved in the horizontal direction within a predetermined region including the rotation axis 1C in order for the reference position r1 on the hand H1 to coincide with the rotation axis 1C of the spin chuck 1.

Figure 3:
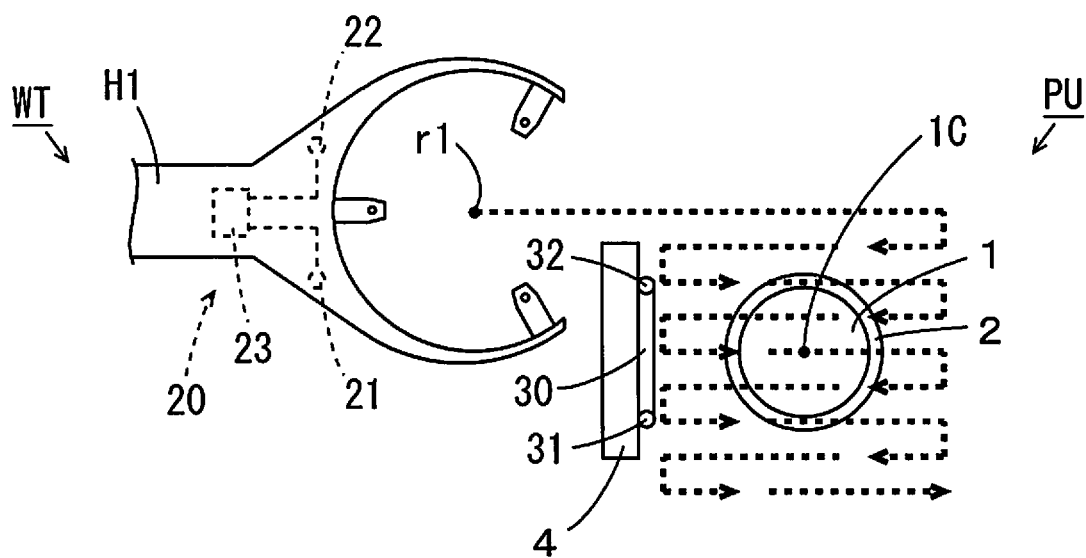
FIG. 3 is a plan view showing one example of movement of the hand during alignment.
Figure 4:
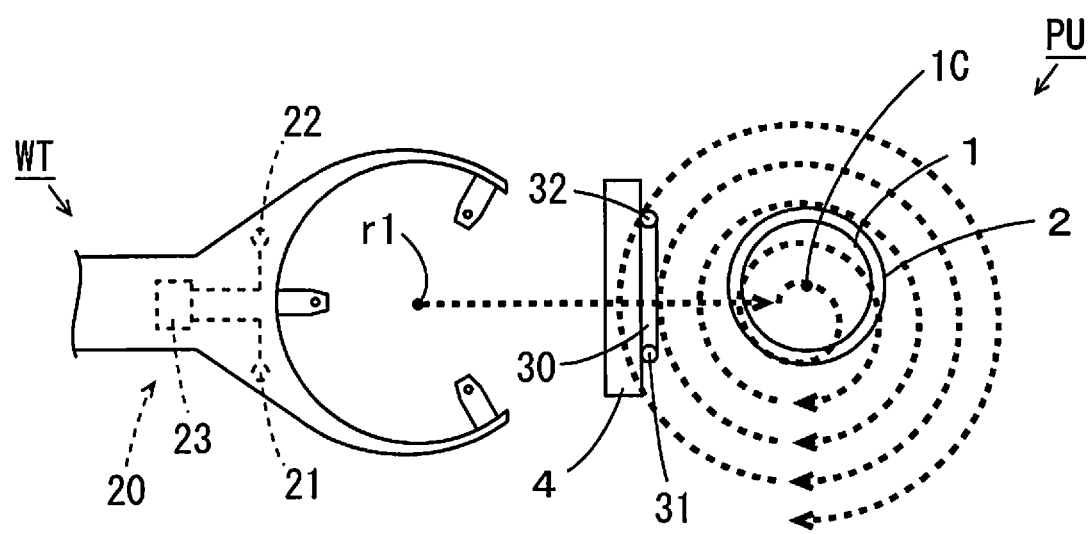
FIG. 4 is a plan view showing another example of the movement of the hand during the alignment.

FIGS. 3 and 4 are plan views showing one example and another example of the movement of the hand H1 during alignment. In the example of FIG. 3, as indicated by thick dotted arrows, the hand H1 is moved such that the reference position r1 moves in a rectangular wave line within a predetermined region including the rotation axis 1C of the spin chuck 1. As indicated by thick dotted arrows in the example of FIG. 4, the hand H1 is moved such that the reference position r1 moves spirally within a predetermined region including the rotation axis 1C of the spin chuck 1.

In such movement of the hand H1, when the reference position r1 on the hand H1 coincides with the rotation axis 1C, the level of the light receiving signal that is output from the optical sensor 20 is maximized. Therefore, the controller 51 can determine whether the reference position r1 has coincided with the rotation axis 1C based on the level of the light receiving signal while acquiring current position information of the hand H1 based on the output signal from the position detector 53, and can acquire the position of the hand H1 when the level of the light receiving signal is maximized as target position information. Further, the controller 51 can align the hand H1 with respect to the spin chuck 1 by moving the hand H1 based on the acquired target position information.

The optical fiber 30 may be provided at another fixed portion in a moving path of the hand H1. In this case, the level of the light receiving signal that is output from the optical sensor 20 may be maximized when the center of the substrate W held by the hand H1 is located at a predetermined position different from the rotation axis 1C of the spin chuck 1. The hand H1 can be aligned with respect to the spin chuck 1 based on the positional relationship between the predetermined position and the rotation axis 1C of the spin chuck 1 such that the center of the substrate W held by the hand H1 coincides with the rotation axis 1C of the spin chuck 1.

Further, the optical fiber 30 may be provided at a portion of the rotation driver 2 as a member that has a certain positional relationship with the spin chuck 1.

[2] Substrate Processing Mode and Teaching Mode

The substrate processing apparatus 100 according to the present embodiment is configured to be settable in a substrate processing mode and a teaching mode. In the substrate processing mode, the substrate transport device WT of FIG. 1 receives the substrate W placed on the substrate supporter of one processing unit, for example, using the hand H1, transports the substrate W and places the substrate W on a substrate supporter of another processing unit. Further, each processing unit performs predetermined processing on the substrate W supported by the substrate supporter.

A design receiving position at which the hand H1 is located when the hand H1 receives the substrate W placed on a predetermined substrate supporter, and a design placement position at which the hand H1 is located when the hand H1 places the substrate W on a predetermined substrate supporter are stored in advance in the controller 51 of FIG. 1 as initial target position information.

An actual receiving position and an actual placement position may deviate from the design receiving position and the design placement position due to an assembly error of a processing unit, wear of a member of a substrate transport device WT and the like that occur in the substrate processing apparatus 100.

As such, in the teaching mode, the above-mentioned alignment operation is performed such that the substrate supporter of the processing unit and the hand H1 have a predetermined positional relationship suitable for receiving and transferring of the substrate W. In this case, the controller 51 can generate the actual position of the hand H1 when the substrate supporter and the hand H1 have the predetermined positional relationship as the target position information. In the present embodiment, the position at which the hand H1 is located when the center of the substrate W held by the hand H1 coincides with the rotation axis 1C of the spin chuck 1 is generated as the target position information in the teaching mode. The initial target position information is updated with the generated target position information. In the substrate processing mode, the substrate W is transported based on the updated target position information. Thus, a transport error and a processing defect of the substrate W are prevented.

[3] Functional Configuration of Controller 51

Figure 5:
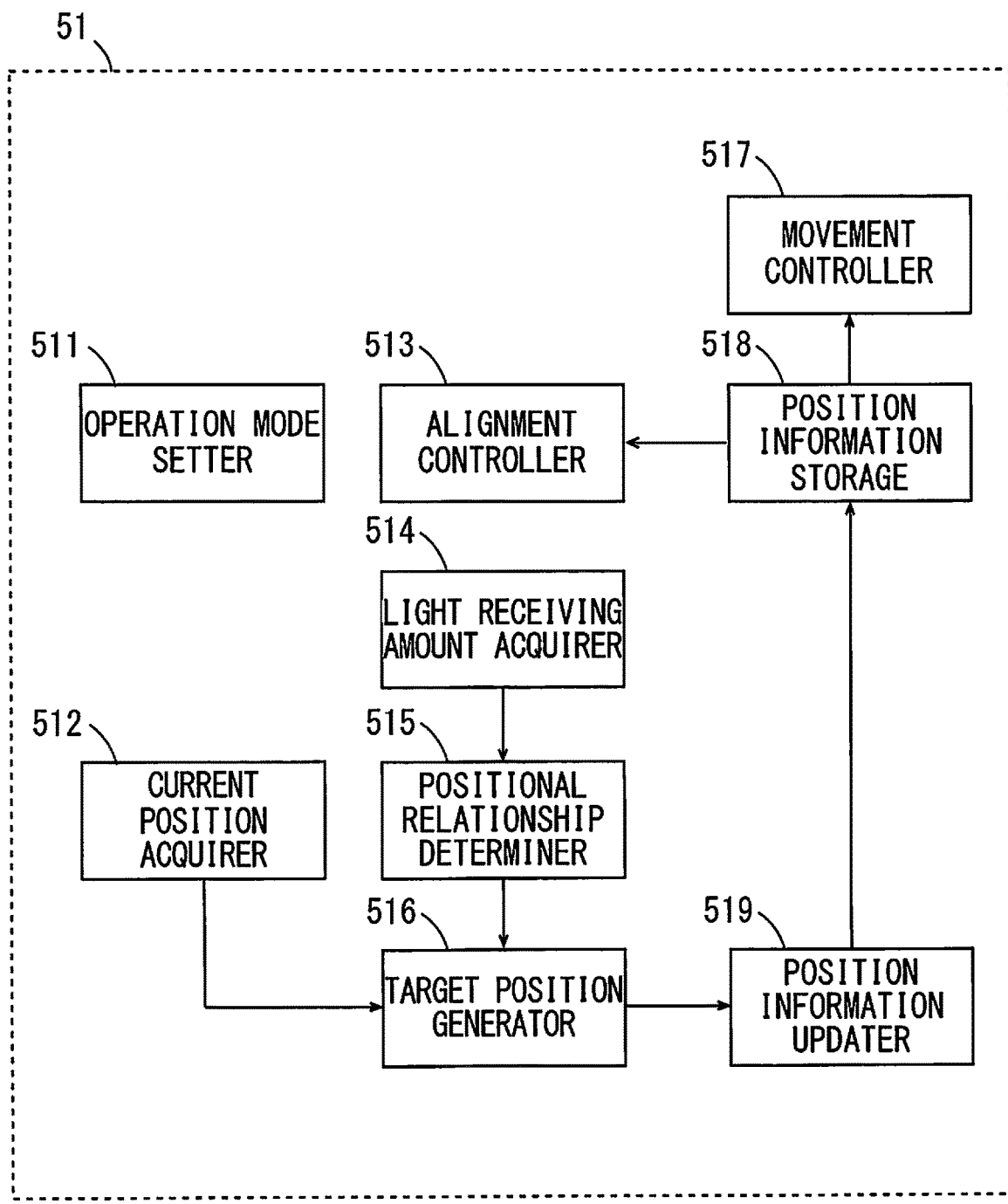
FIG. 5 is a block diagram showing a functional configuration of a controller of FIG. 1.

In the following description, the receiving position and the placement position at which the hand H1 is located with respect to a predetermined substrate supporter are collectively termed as suitable receiving transferring positions. FIG. 5 is a block diagram showing a functional configuration of the controller 51 of FIG. 1. The controller 51 includes an operation mode setter 511, a current position acquirer 512, an alignment controller 513, a light receiving amount acquirer 514, a positional relationship determiner 515, a target position generator 516, a movement controller 517, a position information storage 518 and a position information updater 519.

The controller 51 is constituted by a CPU (Central Processing Unit), a RAM (Random Access Memory) and a ROM (Read Only Memory). A function of each constituent element of the controller 51 is implemented when the CPU executes a computer program stored in the ROM or another storage medium. Part or all of the constituent elements of the controller 51 may be implemented by hardware such as an electronic circuit.

The operation mode setter 511 sets the substrate processing apparatus 100 in the substrate processing mode or the teaching mode based on an operation performed with use of an operation unit (not shown) by a user, for example. The position information storage 518 stores design receiving transferring positions at which the substrate transport device WT is located when the substrate transport device WT receives the substrate W from and transfers the substrate W to the plurality of substrate supporters as initial target position information.

In the teaching mode, in order to align the hand H1 with respect to the one substrate supporter, the alignment controller 513 controls the driver 52 of FIG. 1 such that the hand H1 is moved based on the initial target position information stored in the position information storage 518, and then controls the driver 52 of FIG. 1 such that the hand H1 is moved within a predetermined region including one substrate supporter.

In the teaching mode, the light receiving amount acquirer 514 acquires the level of the light receiving signal that is output from the optical sensor 20 in a predetermined sampling period while the hand H1 is moved within a predetermined region of the one substrate supporter by the alignment controller 513.

In the teaching mode, the positional relationship determiner 515 determines whether the hand H1 has a predetermined positional relationship with the substrate supporter based on the levels of a plurality of light receiving signals supplied from the light receiving amount acquirer 514. In the present embodiment, the positional relationship determiner 515 determines that the center of the substrate W held by the hand H1 coincides with the rotation axis 1C of the spin chuck 1 when the level of the light receiving signal is maximized.

In the teaching mode, the current position acquirer 512 synchronizes with the sampling period for the level of the receiving light signal and acquires the position of the hand H1 as the current position information while the hand H1 is moved within the predetermined region of the one substrate supporter by the alignment controller 513.

In the teaching mode, the target position generator 516 generates the position at which the hand H1 is located when the hand H1 has the predetermined positional relationship with the substrate supporter as the target position information based on a result of determination of the positional relationship determiner 515 and a plurality of pieces of current position information supplied from the current position acquirer 512. In the present embodiment, the target position generator 516 generates the position at which the hand H1 is located when the hand H1 is aligned with respect to the one substrate supporter as the target position information. Specifically, the target position generator 516 generates the current position information acquired when the level of the light receiving signal is maximized as the target position information.

In the teaching mode, the position information updater 519 updates the initial target position information stored in the position information storage 518 with the target position information generated by the target position generator 516.

In the substrate processing mode, the movement controller 517 controls the driver 52 of FIG. 1 based on the target position information stored in the position information storage 518. Thus, the hand H1 transports the substrate to the spin chuck 1 such that the center of the substrate W held by the hand H1 coincides with the rotation axis 1C of the spin chuck 1.

[4] Operation of Substrate Processing Apparatus 100 in Teaching Mode

Figure 6:
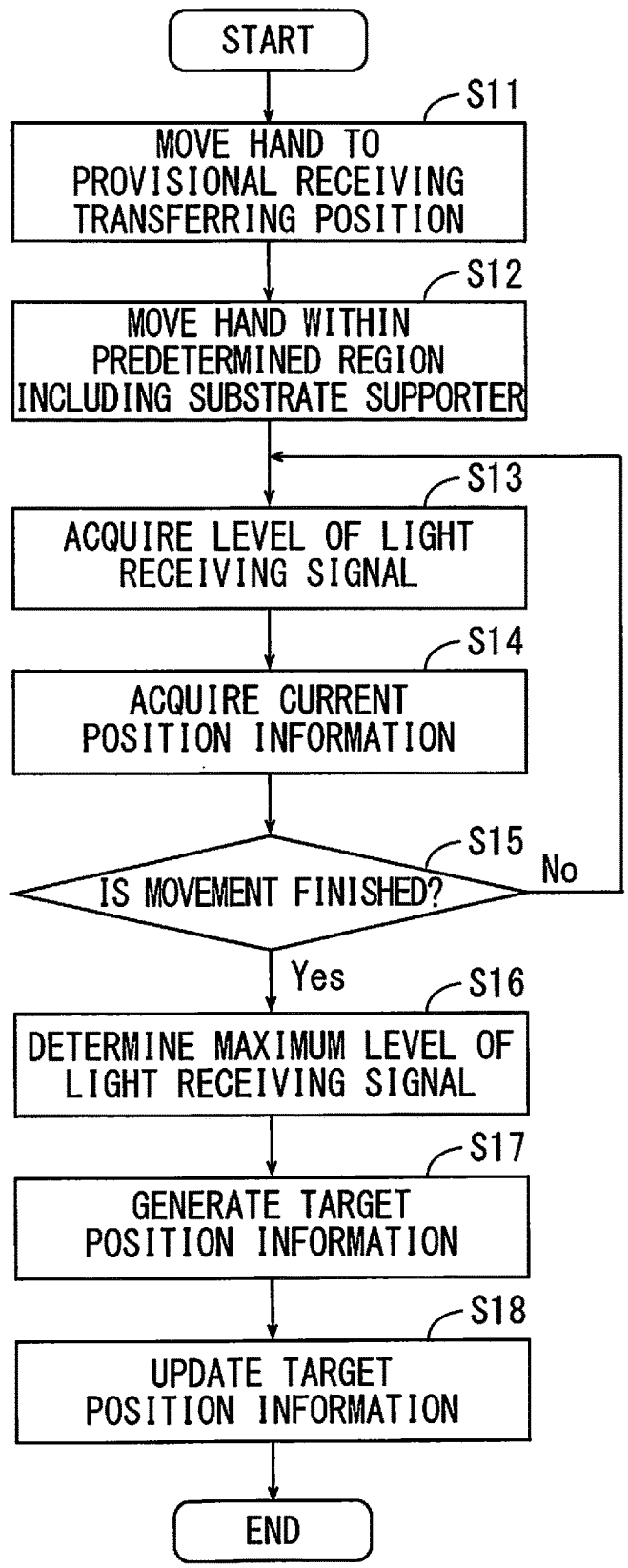
FIG. 6 is a flow chart showing an operation of the substrate processing apparatus in a teaching mode.

FIG. 6 is a flow chart showing an operation of the substrate processing apparatus 100 in the teaching mode. Here, teaching of the hand H1 with respect to one substrate supporter is described. In an initial state, the substrate processing apparatus 100 is set in the teaching mode. Further, initial target position information with respect to the one substrate supporter is stored in advance in the position information storage 518 of FIG. 5.

In this case, the alignment controller 513 moves the hand H1 to a receiving transferring position corresponding to the one substrate supporter based on initial target position information stored in the position information storage 518 (step S11).

Next, the alignment controller 513 moves the hand H1 within a predetermined region including the one substrate supporter (step S12). Further, the light receiving amount acquirer 514 acquires the level of the light receiving signal that is output from the optical sensor 20 (step S13). Further, the light receiving amount acquirer 514 acquires the level of the light receiving signal that is output from the optical sensor 20 (step S13). Simultaneously, the current position acquirer 512 acquires the current position information based on the output signal of the position detector 53 of FIG. 1 (step S14).

Thereafter, the positional relationship determiner 515 determines whether the movement of the hand H1 within the predetermined region has finished (step S15). When the movement of the hand H1 within the predetermined region has not finished, the positional relationship determiner 515 returns to the step S13. Thus, levels of the plurality of light receiving signals and a plurality of pieces of current position information are acquired.

When the movement of the hand H1 within the predetermined region is finished in the step S15, the positional relationship determiner 515 determines the maximum level out of the acquired levels of the plurality of light receiving signals (step S16).

Then, the target position generator 516 generates the current position information corresponding to the maximum level of the light receiving signal as the target position information (step S17).

Finally, the position information updater 519 updates the initial target position information stored in the position information storage 518 based on the generated target position information (step S18).

[5] Overall Configuration of Substrate Processing Apparatus 100

Figure 7:
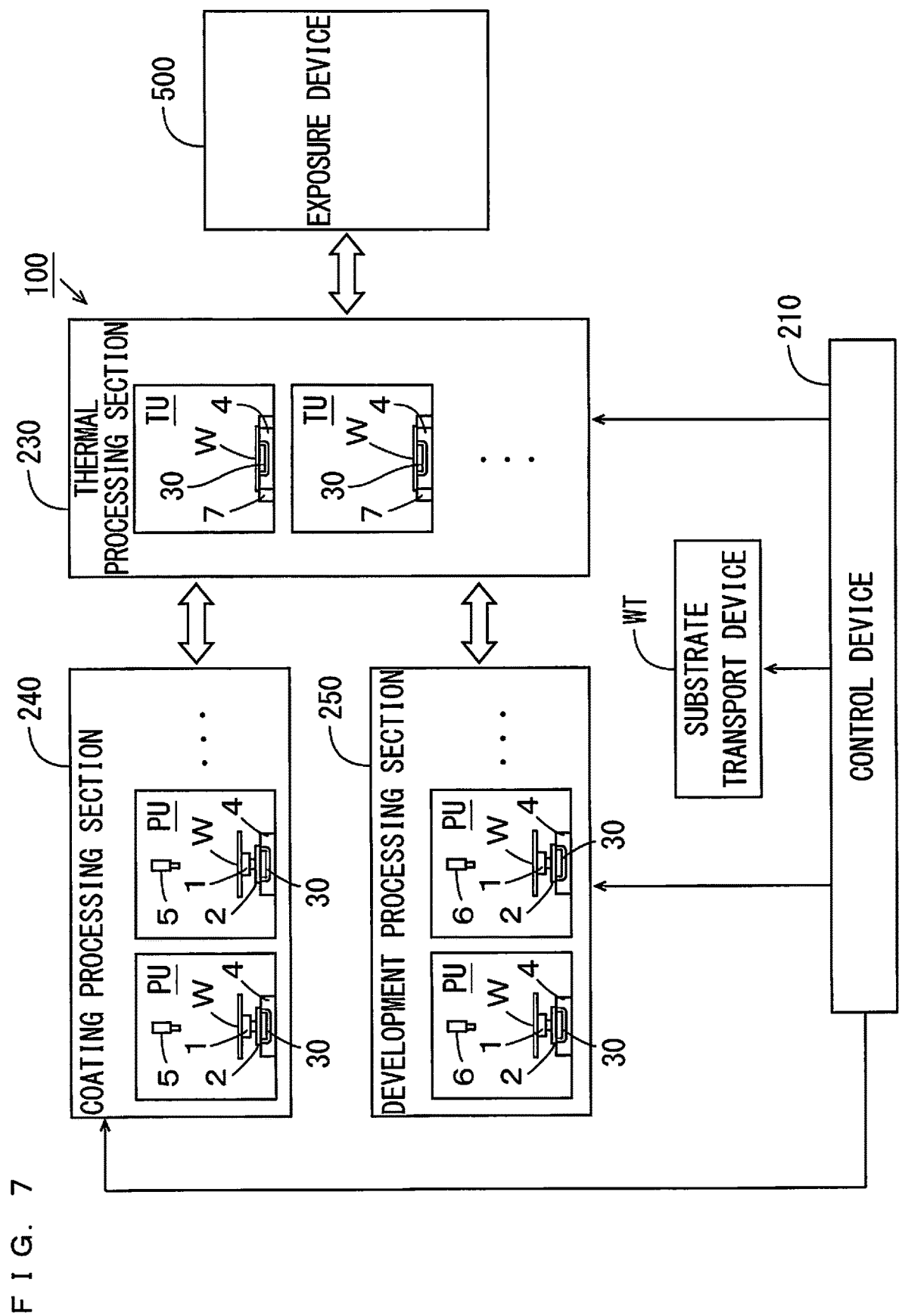
FIG. 7 is a schematic block diagram showing an overall configuration of the substrate processing apparatus including a substrate transport device and processing units of FIG. 1.

FIG. 7 is a schematic block diagram showing an overall configuration of the substrate processing apparatus 100 including the substrate transport device WT and the processing units PU of FIG. 1. As shown in FIG. 7, the substrate processing apparatus 100 is provided to be adjacent to an exposure device 500, and includes a control device 210, the substrate transport device WT of FIG. 1, a thermal processing section 230, a coating processing section 240 and a development processing section 250.

The control device 210 includes a CPU and a memory, or a microcomputer, for example, and controls the operations of the substrate transport device WT, the thermal processing section 230, the coating processing section 240 and the development processing section 250. Further, the control device 210 supplies an instruction for aligning the hand H1 of the substrate transport device WT of FIG. 1 with respect to a substrate supporter of a predetermined processing unit to the controller 51.

In the substrate processing mode, the substrate transport device WT transports the substrate W among the thermal processing section 230, the coating processing section 240, the development processing section 250 and the exposure device 500.

Each of the coating processing section 240 and the development processing section 250 includes the plurality of processing units PU. A processing liquid nozzle 5 that supplies a processing liquid for forming a resist film on the substrate W rotated by the spin chuck 1 is provided in each of the processing units PU provided in the coating processing section 240 in addition to the configuration of FIG. 1. Thus, the resist film is formed on an unprocessed substrate W. The exposure processing is performed in the exposure device 500 on the substrate W on which the resist film is formed.

A development liquid nozzle 6 for supplying a development liquid to the substrate W rotated by the spin chuck 1 is provided in each of the processing units PU provided in the development processing section 250. Thus, the substrate W on which the exposure processing has been performed by the exposure device 500 is developed.

The thermal processing section 230 includes a plurality of processing units TU that perform heating processing or cooling processing on the substrates W. In each processing unit TU, a temperature adjustment plate 7 is provided as the substrate supporter. The temperature adjustment plate 7 is a heating plate or a cooling plate. In the thermal processing section 230, the thermal processing is performed on the substrate W before the coating processing is performed by the coating processing section 240, after the coating processing is performed by the coating processing section 240, before the development processing is performed by the development processing section 250, after the development processing is performed by the development processing section 250, before the exposure processing is performed by the exposure device 500 or after the exposure processing is performed by the exposure device 500.

Here, as shown in FIG. 7, an optical fiber 30 is attached to a fixed member 4 having a certain positional relationship with a spin chuck 1 similarly to the example of FIG. 1 in each of the plurality of processing units PU provided in the coating processing section 240 and the development processing section 250. Further, in each of the plurality of processing units TU provided in the thermal processing section 230, an optical fiber 30 is attached to a fixed member 4 having a certain positional relationship with the temperature adjustment plate 7.

Thus, during the teaching mode of the substrate processing apparatus 100, the hand H1 (FIG. 1) of the substrate transport device WT can be aligned with respect to the spin chuck 1 of each of the plurality of processing units PU or the temperature adjustment plate 7 in each of the plurality of processing units TU.

In the above-mentioned configuration, because the optical fiber 30 is less costly than the optical sensor 20, even when the hand H1 is to be aligned with respect to the large number of the substrate supporters, an increase of the cost required for the alignment is suppressed.

In the above-mentioned substrate processing apparatus 100, a processing unit PU that forms an anti-reflection film on the substrate W may be provided in the coating processing section 240. In this case, a processing unit TU for performing adhesion reinforcement processing to improve adhesion between the substrate W and the anti-reflection film may be provided in the thermal processing section 230. Further, a processing unit PU that forms a resist cover film for protecting the resist film formed on the substrate W may be provided in the coating processing section 240.

Further, in the above-mentioned substrate processing apparatus 100, a substrate platform on which the substrate W being transported by the substrate transport device WT is temporarily placed may be provided. The substrate platform has a configuration in which a plurality (three, for example) of support pins are provided as substrate supporters, for example. In this case, the optical fiber 30 is attached onto the fixed member 4 having a certain positional relationship with the plurality of support pins, whereby the hand H1 of the substrate transport device WT can be aligned with respect to the plurality of support pins.

[6] Effects (a) In the above-mentioned substrate processing apparatus 100, the optical sensor 20 is provided at the hand H1 that transports the substrate W to the processing unit PU, TU, and the optical fiber 30 is provided at the fixed member 4 that has the certain positional relationship with the substrate supporter in the processing unit PU, TU or is provided at the rotation driver 2.

When the hand H1 has the predetermined positional relationship with the substrate supporter in the processing unit PU, TU, the light emitted from the first light emitter 21 is received by the second light receiver 31 to be led to the second light emitter 32 by the optical fiber 30, and the light emitted from the second light emitter 32 is received by the first light receiver 22. Therefore, whether the hand H1 has the predetermined positional relationship with the substrate supporter can be determined based on the light receiving signal that is output from the optical sensor 20.

In this case, because the optical sensor 20 is electrically independent from the optical fiber 30, the wiring between the fixed member 4 in the processing unit PU, TU and the hand H1 is not necessary. Therefore, the configuration for detecting the position of the hand H1 with respect to the substrate supporter is not complicated. Further, the position of the hand H1 with respect to the substrate supporter can be detected at low cost.

As a result, the hand H1 can be aligned with respect to the substrate supporter in the processing unit PU, TU with a simple configuration and at low cost.

(b) Further, in the above-mentioned substrate processing apparatus 100, the hand H1 is aligned with use of the optical sensor 20 and the optical fiber 30 in the teaching mode. In this case, the target position information with respect to the subject substrate supporter is generated, and the initial target position information stored in the position information storage 518 is updated based on the generated target position information. In the substrate processing mode, the movement of the hand H1 is controlled based on the target position information updated in the teaching mode. Thus, in the substrate processing mode, the hand H1 can be easily aligned with respect to the substrate supporter.

Figure 8:
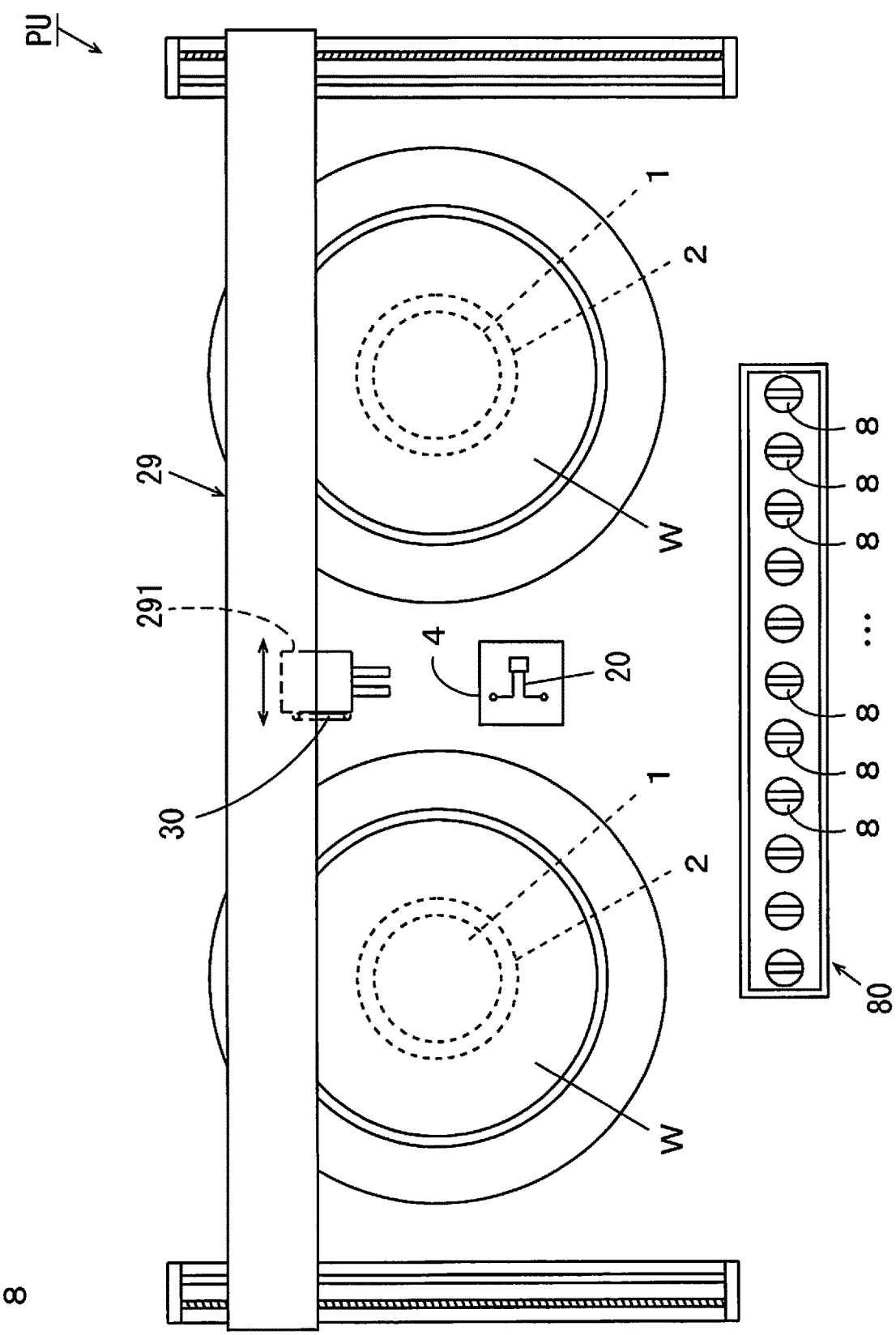
FIG. 8 is a plan view showing one example of a processing unit according to another embodiment.

[7] Other Embodiments (a) A processing unit PU provided in the coating processing section 240 of FIG. 7 may have a following configuration. FIG. 8 is a plan view showing one example of the processing unit PU according to another embodiment. As shown in FIG. 8, the processing unit PU of the present example includes a fixed member 4, a plurality of spin chucks 1, a plurality of processing liquid nozzles 8 and a waiting section 80. In the present embodiment, two spin chucks 1 are provided in the processing unit PU.

The fixed member 4 is fixed between the two spin chucks 1. Also in the present example, the fixed member 4 has a certain positional relationship with two spin chucks 1.

During the wait, each processing liquid nozzle 8 is inserted into the waiting section 80. Various processing liquids are supplied from a processing liquid supply system (not shown) to each processing liquid nozzle 8. The processing unit PU further includes a nozzle gripper 291 and a driver 29. The nozzle gripper 291 is configured to be able to grip each processing liquid nozzle 8. The driver 29 moves the nozzle gripper 291 in the horizontal direction. When the nozzle gripper 291 is moved, any one processing liquid nozzle 8 out of the plurality of processing liquid nozzles 8 is gripped by the nozzle gripper 291 and moved to a position above the substrate W by the driver 29. The processing liquid is discharged from the processing liquid nozzle 8 while the spin chuck 1 is rotated. Thus, the processing liquid is supplied onto the rotating substrate W.

Here, in the processing unit PU of FIG. 8, the optical fiber 30 is provided at the nozzle gripper 291, and the optical sensor 20 is provided at the fixed member 4. Thus, the nozzle gripper 291 can be aligned with respect to the fixed member 4 based on a light receiving signal that is output from the optical sensor 20. In this case, because the fixed member 4 has certain positional relationships with the two spin chucks 1, the nozzle gripper 291 can be aligned with respect to each spin chuck 1 based on the certain positional relationships. Further, the processing liquid nozzle 8 gripped by the nozzle gripper 291 can be aligned with respect to each spin chuck 1.

In this manner, it is possible to align the processing liquid nozzle 8 with respect to the spin chuck 1 with a simple configuration and at low cost also in the processing unit PU by using the optical sensor 20 and the optical fiber 30.

In the example of FIG. 8, the optical fiber 30 is provided at the nozzle gripper 291, and the optical sensor 20 is provided at the fixed member 4. However, the optical sensor 20 may be provided at the nozzle gripper 291 with the optical fiber 30 provided at the fixed member 4.

Further, a fluid nozzle for supplying gas or a fluid mixture of liquid and gas may be provided in the above-mentioned processing unit PU in addition to the processing liquid nozzles 8. In this case, the fluid nozzle can be aligned with respect to the spin chuck 1.

(b) In a predetermined processing unit PU, one of an optical sensor 20 and an optical fiber 30 may be provided at a film thickness measurer that measures the thickness of a film formed on a substrate W held by a spin chuck 1, a removal nozzle for removing a resist film formed on a partial region extending in a circumferential direction at a periphery of the substrate W or a light emitter of a peripheral portion exposure device for exposing the resist film formed on the partial region extending in the circumferential direction at the periphery of the substrate W. In this case, the other one of the optical sensor 20 and the optical fiber 30 is provided at a fixed member 4 in the processing unit PU, whereby the film thickness measurer, the removal nozzle or the light emitter can be aligned with respect to the spin chuck 1.

(c) While the optical fiber 30 is used as the configuration for emitting the light that is emitted from the first light emitter 21 of the optical sensor 20 to the first light receiver 22 during the alignment of the hand H1 in the above-mentioned embodiment, the present invention is not limited to this. An optical member such as a reflection member or a prism may be used instead of the optical fiber 30, or another light guide other than the optical fiber may be used instead of the optical fiber 30.

(d) While the optical fiber 30 is provided at the fixed member 4 in order for the hand H1 to be aligned with respect to the temperature adjustment plate 7 in the processing unit TU of FIG. 7 in the above-mentioned embodiment, the present invention is not limited to this. The temperature adjustment plate 7 is different from the spin chuck 1 and does not rotate. Therefore, the optical fiber 30 may be provided at the temperature adjustment plate 7. In this case, the size of the space where the optical fiber 30 is provided can be reduced.

(e) While the hand H1 is aligned during the teaching mode in the substrate processing apparatus 100 according to the above-mentioned embodiment, the hand H1 may be aligned during the substrate processing mode. That is, the hand H1 may be aligned with respect to the substrate supporter during the transportation of the substrate W.

(f) In the substrate processing apparatus 100 according to the above-mentioned embodiment, the optical sensor 20 is provided at the hand H1 that transports the substrate W to the processing unit PU, TU, and the optical fiber 30 is provided at the fixed member 4 that has the certain positional relationship with the substrate supporter in the processing unit PU, TU or the rotation driver 2. However, the optical fiber 30 may be provided at the hand H1, or the optical sensor 20 may be provided at the fixed member 4 or the rotation driver 2.

(g) While the optical sensor 20 and the optical fiber 30 are arranged such that light travels in parallel with the up-and-down direction between the optical sensor 20 and the optical fiber 30 in the substrate processing apparatus 100 according to the above-mentioned embodiment, the present invention is not limited to this. The optical sensor 20 and the optical fiber 30 may be arranged such that light travels in parallel with the horizontal direction between the optical sensor 20 and the optical fiber 30. In this case, the optical sensor 20 and the optical fiber 30 are respectively provided at the hand H1 and the fixed member 4 in the processing unit PU, for example, whereby the hand H1 can be aligned in the up-and-down direction with respect to the fixed member 4.

(h) The intensity of the light that is emitted from the first light emitter 21 of the optical sensor 20 and incident on the second light receiver 31 of the optical fiber 30 attenuates according to the distance between the first light emitter 21 and the second light receiver 31. Further, the intensity of the light that is emitted from the second light emitter 32 of the optical fiber 30 and incident on the first light receiver 22 of the optical sensor 20 attenuates according to the distance between the second light emitter 32 and the first light receiver 22.

As such, the distance between the optical sensor 20 and the optical fiber 30 may be calculated based on the level of the light receiving signal acquired from the optical sensor 20. For example, the table showing the relationship, between the distance from the optical sensor 20 to the optical fiber 30 when the light emitted from the first light emitter 21 is incident on the first light receiver 22 through the optical fiber 30, and the level of the light receiving signal that is output from the optical sensor 20 when the light emitted from the first light emitter 21 is incident on the first light receiver 22 through the optical fiber 30, is stored in the controller 51. In this case, the distance between the optical sensor 20 and the optical fiber 30 can be calculated based on the stored table.

(i) When a substrate processing apparatus 100 is structured by coupling of a plurality of processing devices, the optical sensor 20 and the optical fiber 30 can be used to confirm the coupling state of the plurality of processing devices. For example, the optical sensor 20 and the optical fiber 30 are attached to one processing device and another processing device, so that the light emitted from the first light emitter 21 of the optical sensor 20 is incident on the second light receiver 31 of the optical fiber 30, and the light emitted from the second light emitter 32 is incident on the first light receiver 22 when the one processing device and the other processing device are accurately coupled to each other. In this case, whether the one processing device and the other processing device are accurately coupled to each other can be determined based on the light receiving signal that is output from the optical sensor 20.

(j) While the positional relationship determiner 515 of FIG. 5 according to the above-mentioned embodiment determines that the hand H1 is aligned at a time point at which the maximum level of the light receiving signal is acquired based on the levels of the plurality of light receiving signals supplied from the light receiving amount acquirer 514, the present invention is not limited to this. When the level of the light receiving signal supplied from the light receiving amount acquirer 514 exceeds a predetermined threshold value, the light receiving amount acquirer 514 may determine that the hand H1 is aligned at a time point at which the light receiving signal is acquired.

[8] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate processing apparatus 100 is an example of a substrate processing apparatus, the hand H1, the nozzle gripper 291 and the processing liquid nozzle 8 are examples of a movable portion, the first light emitter 21 is an example of a first light emitter, the first light receiver 22 is an example of a first light receiver, the optical sensor 20 is an example of an optical sensor, the second light receiver 31 is an example of a second light receiver, the second light emitter 32 is an example of a second light emitter, and the optical fiber 30 is an example of a light guide member.

Further, the spin chuck 1 and the temperature adjustment plate 7 are examples of a substrate supporter, the fixed member 4 and the rotation driver 2 are examples of a fixed portion and a fixed member, the hand H1 is an example of a transport holder, the processing unit PU is an example of a processing unit, the spin chuck 1 is an example of a rotation holder, the nozzle gripper 291 and the processing liquid nozzle 8 are examples of a processing member and a fluid nozzle, the positional relationship determiner 515 is an example of a determiner, and the driver 52 and the driver 29 are examples of a driver.

Further, the alignment controller 513 is an example of an alignment controller, the current position acquirer 512 is an example of an acquirer, the target position generator 516 is an example of a generator, the movement controller 517 is an example of a movement controller, the configuration including the positional relationship determiner 515, the optical fiber 30, the optical sensor 20, the hand H1 and the fixed member 4, and the configuration including the positional relationship determiner 515, the optical fiber 30, the optical sensor 20, the nozzle gripper 291, the processing liquid nozzle 8 and the fixed member 4 are examples of an alignment device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate processing apparatus that performs processing on a substrate, comprising:
a fixed portion;
a movable portion that is movable relative to the fixed portion;
an optical sensor that is provided at one of the fixed portion and the movable portion and has a first light emitter and a first light receiver; and
an optical fiber that is provided at another one of the fixed portion and the movable portion and has a first end surface corresponding to the first light emitter and a second end surface corresponding to the first light receiver, wherein the first light emitter, the first light receiver, the second end surface and the first end surface are arranged such that light emitted from the first light emitter is received by the first end surface when the movable portion has a predetermined positional relationship with the fixed portion, and are arranged such that light emitted from the second end surface is received by the first light receiver when the movable portion has the predetermined positional relationship with the fixed portion.

2. The substrate processing apparatus according to claim 1, further comprising a substrate supporter that supports the substrate, wherein the fixed portion includes a fixed member that has a certain positional relationship with the substrate supporter, and the movable portion includes a transport holder that holds and transports the substrate to the substrate supporter.

3. The substrate processing apparatus according to claim 2, further comprising a processing unit that performs processing on the substrate, wherein the substrate supporter includes a rotation holder that holds and rotates the substrate in the processing unit, and the fixed member has a certain positional relationship with the rotation holder.

4. The substrate processing apparatus according to claim 1, comprising a plurality of substrate supporters that support the substrate, wherein the fixed portion includes a plurality of fixed members having certain positional relationships with the plurality of substrate supporters, the movable portion includes a transport holder that holds and transports the substrate to the plurality of substrate supporters, the optical sensor is provided at the transport holder, and the optical fiber is provided at each of the plurality of fixed members.

5. The substrate processing apparatus according to claim 1, further comprising a rotation holder that holds and rotates the substrate, wherein the fixed portion includes a fixed member that has a certain positional relationship with the rotation holder, and the movable portion includes a processing member that performs predetermined processing on the substrate held by the rotation holder.

6. The substrate processing apparatus according to claim 5, wherein the processing member is a fluid nozzle that supplies fluid to the substrate held by the rotation holder.

7. The substrate processing apparatus according to claim 1, further comprising a determiner that determines whether the movable portion has the predetermined positional relationship with the fixed portion based on an output signal of the optical sensor.

8. The substrate processing apparatus according to claim 7, further comprising:

a driver that moves the movable portion relative to the fixed portion;

an alignment controller that controls the driver during an alignment operation such that the movable portion is moved within a predetermined region including the fixed portion;

an acquirer that acquires a position of the movable portion as current position information during the alignment operation;

a generator that generates a position of the movable portion when the movable portion has the predetermined positional relationship with the fixed portion as target position information during the alignment operation based on the current position information acquired by the acquirer and a result of determination of the determiner; and a movement controller that controls the driver during a substrate processing operation such that the movable portion is moved based on the target position information generated by the generator.

9. The substrate processing apparatus according to claim 8, wherein the substrate processing apparatus is settable in a substrate processing mode or a teaching mode, and the alignment operation is performed during the teaching mode, and the substrate processing operation is performed during the substrate processing mode.

10. An alignment device comprising:

a fixed portion;

a movable portion that is movable relative to the fixed portion;

an optical sensor that is provided at one of the fixed portion and the movable portion and has a first light emitter and a first light receiver;

an optical fiber that is provided at another one of the fixed portion and the movable portion, and has a first end surface corresponding to the first light emitter and a second end surface corresponding to the first light receiver; and a determiner that determines whether the movable portion has a predetermined positional relationship with the fixed portion based on an output signal of the optical sensor, wherein the first light emitter, the first light receiver, the second light emitter end surface and the first end surface are arranged such that from the first light emitter is received by the first end surface when the movable portion has the predetermined positional relationship with the fixed portion, and are arranged such that light emitted from the second end surface is received by the first light receiver when the movable portion has the predetermined positional relationship with the fixed portion.

11. A substrate processing method for performing processing on a substrate with use of a substrate processing apparatus, including:

arranging a first light emitter, a first light receiver, a second end surface and a first end surface such that light emitted from the first light emitter is received by the first end surface when a movable portion provided with an optical fiber having the first end surface and the second end surface has a predetermined positional relationship with a fixed portion provided with an optical sensor having the first light emitter and the first light receiver, and arranging the first light emitter, the first light receiver, the second end surface and the first end surface such that light emitted from the second end surface is received by the first light receiver when the movable portion provided with the optical fiber having the first end surface and the second end surface has the predetermined positional relationship with the fixed portion provided with the optical sensor having the first light emitter and the first light receiver, and moving the movable member relative to the fixed portion.

12. The substrate processing method according to claim 11, wherein
the substrate processing apparatus includes a substrate supporter that supports the substrate,
the fixed portion includes a fixed member having a certain positional relationship with the substrate supporter, and
the movable portion includes a transport holder that holds and transports the substrate to the substrate supporter.

13. The substrate processing method according to claim 12, wherein
the substrate processing apparatus further includes a processing unit that performs processing on the substrate,
the substrate supporter includes a rotation holder that holds and rotates the substrate in the processing unit, and
the fixed member has a certain positional relationship with the rotation holder.

14. The substrate processing method according to claim 11, wherein
the substrate processing apparatus includes a plurality of substrate supporters that support the substrate,
the fixed portion includes a plurality of fixed members having certain positional relationships with the plurality of substrate supporters,
the movable portion includes a transport holder that holds and transports the substrate to the plurality of substrate supporters,
the optical sensor is provided at the transport holder, and
the optical fiber is provided at each of the plurality of fixed members.

15. The substrate processing method according to claim 11, wherein
the substrate processing apparatus further includes a rotation holder that holds and rotates the substrate,
the fixed portion includes a fixed member that has a certain positional relationship with the rotation holder, and
the movable portion includes a processing member that performs predetermined processing on the substrate held by the rotation holder.

16. The substrate processing method according to claim 15, wherein
the processing member is a fluid nozzle that supplies fluid to the substrate held by the rotation holder.

17. The substrate processing method according to claim 11, further including determining whether the movable portion has the predetermined positional relationship with the fixed portion based on an output signal of the optical sensor.

18. The substrate processing method according to claim 17, wherein
the substrate processing apparatus is configured to be able to perform an alignment operation and a substrate processing operation, and
the substrate processing method further includes
moving the movable portion within a predetermined region including the fixed portion during the alignment operation of the substrate processing apparatus,
acquiring a position of the movable portion as current position information during the alignment operation of the substrate processing apparatus,
generating a position of the movable portion when the movable portion has the predetermined positional relationship with the fixed portion as target position information during the alignment operation of the substrate processing apparatus based on the acquired current position information and the result of determination, and
moving the movable portion relative to the fixed portion based on the generated target position information during the substrate processing operation of the substrate processing apparatus.

19. The substrate processing method according to claim 18, wherein
the substrate processing apparatus is settable in a substrate processing mode or a teaching mode, and
the alignment operation is performed when the substrate processing apparatus is set in the teaching mode, and the substrate processing operation is performed when the substrate processing apparatus is set in the substrate processing mode.

20. An alignment method including:
moving a movable member provided with an optical fiber having a first end surface and a second end surface relative to a fixed portion provided with an optical sensor having a first light emitter and a first light receiver;
emitting light from the first light emitter of the optical sensor, and receiving light that is received by the first end surface of the optical fiber and then emitted from the second end surface of the optical fiber using the first light receiver of the optical sensor; and
determining whether the movable portion has a predetermined positional relationship with the fixed portion based on an output signal of the optical sensor.

* * * * *